United States Patent [19]
Gontowski, Jr. et al.

[11] 4,454,416
[45] Jun. 12, 1984

[54] PHOTO-ELECTRIC CIRCUIT EMPLOYING CURRENT MIRRORS

[75] Inventors: Walter S. Gontowski, Jr., Thompson, Conn.; Edward Chalfin, Shrewsbury, Mass.

[73] Assignee: Sprague Electric Company, North Adams, Mass.

[21] Appl. No.: 339,032

[22] Filed: Jan. 13, 1982

[51] Int. Cl.³ .......................... H01J 40/14; H03F 3/60
[52] U.S. Cl. ................................. 250/214 A; 330/288
[58] Field of Search ........... 250/214 P, 214 C, 214 A, 250/214 R, 211 J; 330/288, 308; 307/311

[56] References Cited

U.S. PATENT DOCUMENTS

| | | | |
|---|---|---|---|
| 3,424,908 | 1/1969 | Sitter | 250/206 |
| 4,085,411 | 4/1978 | Genesi | 354/51 |
| 4,118,621 | 10/1970 | Monticelli et al. | 330/288 |
| 4,199,753 | 4/1980 | Gontowski, Jr. | 340/555 |
| 4,216,379 | 8/1980 | Genesi | 250/214 |

OTHER PUBLICATIONS

Dennis M. Monticelli; A Versatile Monolithic IC Building Block for Light-Sensing Applications, IEEE Journal of Solid State Circuits, vol. SC-13, No. 6, Dec. 1978 pp. 873-881.

*Primary Examiner*—David C. Nelms
*Assistant Examiner*—Ernest Austin, II

[57] ABSTRACT

A current mirror amplifier including three or more tandem stages has a photo diode connected, as usual, with one end at the input of the first stage, but with the other end at the input of a third or later stage, which third or later stage is made up of transistors of the same polarity type (NPN) as make up the first stage. Consequently a very low reverse bias is advantageously applied to the photo diode and the linearity and stability of the resulting photo electric device is enhanced with respect to changing input light levels and with respect to variations in DC supply voltage.

3 Claims, 7 Drawing Figures

PHOTO-ELECTRIC CIRCUIT EMPLOYING CURRENT MIRRORS

BACKGROUND OF THE INVENTION

This invention relates to photo-sensing circuits including a photo diode and a photo-current amplifier. Such a light detector system is described by R. Genesi in his U.S. Pat. No. 4,085,411, issued Apr. 18, 1978 and assigned to the same assignee as is the present invention. A light-detector in that patent employs a photo diode connected to a multistage current mirror circuit. The photo diode is connected between the input of the first stage and a DC voltage supply buss. In a copending application by W. Gontowski, Ser. No. 296,748, filed Aug. 27, 1981 and assigned to the same assignee as the present invention, a two terminal light sensor is described that may include a photo diode connected to the input of a multistage current mirror amplifier. For many uses these circuits provide current outputs that are substantially proportional to the intensity of ambient light. However, any variation in supply voltage will cause corresponding changes to appear in the output current.

It is, therefore, an object of this invention to provide a more stable photo diode and current mirror amplifier combination.

It is a further object of this invention to provide a two-terminal light sensor that is substantially unaffected by variations in the supply voltage.

SUMMARY OF THE INVENTION

A stable photo-electric device includes a photo diode and a current mirror amplifier made up of a plurality of tandem-connected stages. A photo diode is connected between the input of the first stage and the input of a subsequent stage, both of which are formed of one polarity-type transistors; e.g. NPN.

This invention recognizes the principle that the branch currents flowing in a first stage of a multistage current mirror amplifier are smaller than the corresponding branch currents flowing in a subsequent stage of that multistage current mirror amplifier and so a photo diode whose current is to be amplified may be connected between the inputs of the first and subsequent stages, respectively, to obtain a small and relatively stable reverse voltage across the photo diode. When those photo-diode-connected inputs have an equal number of serially connected forward conducting PN junctions to a common circuit point to provide a low value of reverse voltage across the photo diode, this low reverse voltage is essentially invarient with changes in signal level or changes in DC supply voltage.

The output current diverted by the photo diode from the input current of the above-noted subsequent stage does in no way introduce error or non linearities to the transfer characteristics of the multistage amplifier because, of course, these two currents vary proportionally and have the same ratio whatever their magnitudes may be.

DESCRIPTION OF THE PREFERRED EMBODIMENTS

Figure 1:
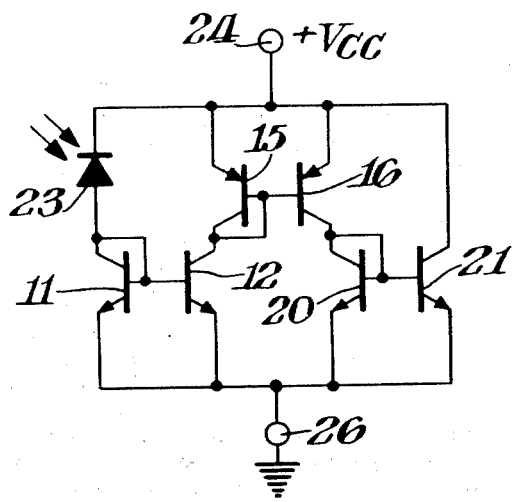
FIG. 1 shows a photo-sensing circuit of the prior art.

With reference to FIG. 1, a first current-mirror amplifier stage consists of an input transistor 11 and output transistor 12. A second current-mirror stage made up of PNP transistors 15 and 16 has its input connected to the output of the first stage. The output of the second stage is directly connected to the input of a third stage consisting of transistors 20 and 21. Photo diode 23 is connected to the input of the first stage and the positive DC power supply voltage terminal 24. The negative DC power supply voltage terminal 26 is shown connected to ground. As is explained by Gontowski in the aforementioned patent application, this two terminal circuit may be connected to a remote DC power supply voltage through a remote resistor (not shown). The circuit of FIG. 1 draws essentially no current when there is no light. However, when exposed to light, the photo diode generates a current proportional to the intensity of the light. The photo diode current is amplified and produces a voltage drop across the resistor (not shown).

It will be noted that the photo diode 23 in FIG. 1 is connected in the direction whereby it tends to be reverse biased. Furthermore, the greater the light intensity becomes the larger the reverse bias voltage becomes.

Figure 2:
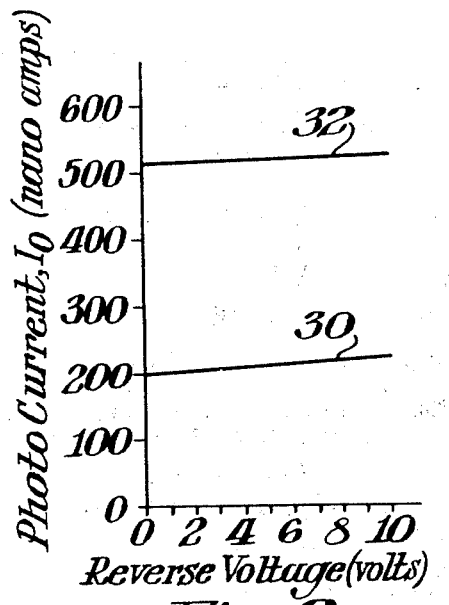
FIG. 2 is a graph of a typical silicon photo-sensing diode as in FIG. 1 showing the output current as a function of diode reverse bias voltage at two ambient light levels.

A typical integrated circuit 600 square mil (0.0036 mm$^2$) photo diode is represented in the graph of FIG. 2. Line 30 represents the photo current as a function of reverse bias voltage. At a moderate light level the slope of this line 30 is 0.75%/volt. Line 32 is for a stronger light level and has a slope of 0.69%/volt.

Figure 3:
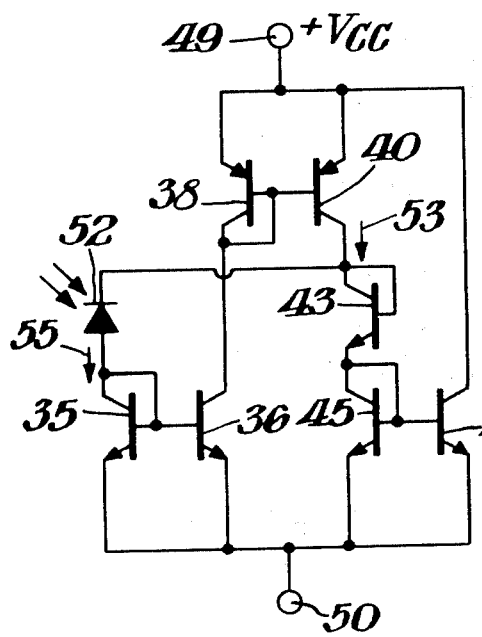
FIG. 3 shows a photo-sensing circuit of this invention.

For a two-terminal photo sensor of the kind shown in FIG. 1, the reverse voltage across the photo diode 23 may be expected to change by as much as 5 or even 10 volts when the ambient light changes by several orders of magnatude. In the circuit of FIG. 3 there are also three tandum connected current-mirror stages. The input transistor 35 of the stage is also diode connected. Transistor 36 in the output branch of the first stage has its collector directly connected to that of transistor 38 serving as the diode-connected input transistor of the second stage. Transistor 40 serves as the output of the second stage. It is connected to the third stage input branch comprised of diode-connected transistor 43 and diode-connected transistor 45. Transistor 47 in the output branch of the third stage has its collector tied back to the positive DC power supply terminal 49. Thus, the output transistor 47 is directly across the ground (50) and positive (49) DC power supply terminals.

The photo diode 52 is connected between the input of the first stage and the input of the third stage in the polarity tending to give it a reverse voltage.

When the base emitter junction area of transistor 36 is greater (e.g. by a factor of 5) than the base emitter junction area of transistor 35, the first stage provides a current gain (e.g. of about 5). The current 53 flowing in the output branch of the second stage through the input branch of the third stage will typically cause a voltage drop across the diode-connected transistor 43 of about 0.7 volts. The anode of the photo diode 52 is "one $V_{BE}$" above the ground potential, while the cathode of the photo diode 52 is "two $V_{BE}$" from ground potential, and the photo diode 52 will tend to be reverse biased. In fact, it is typically reverse biased in this circuit from 0.5 to 0.9 volts. This voltage is a function primarily of the magnitude of the current 53. However, the voltage across the diode connected transistor 43 is a logarythmic function of the current 53. Furthermore, the current 53 is essentially no longer a significant function of the DC supply voltage appearing across terminals 49 and 50.

The circuit of FIG. 3 was built with the current gain of the first and second stages each 5. The collector current 53 of transistor 40 (namely the output current of the second stage) is 25 times greater than the photo diode current 55. The photo diode reverse bias $V_{rb}$ in FIG. 3 may be expressed as $$V_{rb} = 2V_T \ln(AI_{55}/I_o) - V_T \ln(I_{55}/I_o) = V_T \ln A^2(I_{55}/I_o)$$

where A is the gain, 25. Though small, the reverse voltage $V_{rb}$ is still a function of the photo-current $I_{55}$.

Since the current through diode connected transistor 45 is 25 times that of diode connected transistor 35, the voltage across the former is greater than that of the later and transistor 43 may be omitted or shorted and the photo diode will still be reverse biased.

Figure 4:
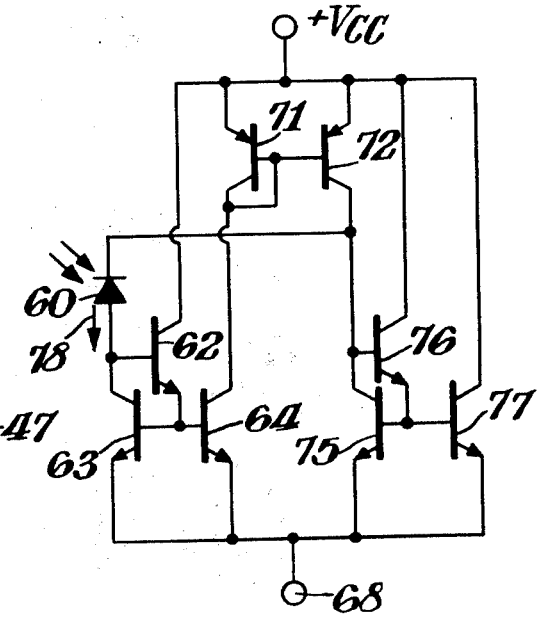
FIGS. 4, 5, 6 and 7 show four other embodiments, respectively, of photo-sensing circuits of this invention.

The circuit of FIG. 4 represents such a circuit having exactly two serially connected PN junctions in each of the input branches of the first and third current-mirror stages, respectively. The photo diode 60 has its anode connected to the input branch of the first stage consisting of transistors 62, 63, and 64. The base emitter junctions of transistor 62 and 63 represents the two $V_{BE}$ drops between a ground terminal 68 and the anode of photo diode 60. The output of transistor 64 is connected to the input of the second stage consisting of transistors 71 and 72. The output of the second stage is connected to the input of the third stage which consists of transistors 75, 76 and 77. The cathode of the photo diode 60 is held positive with respect to the ground terminal 68 by the amount of the voltage drops across the base emitter junctions of transistors 75 and 76. When the output transistors of the three stages 64, 72, and 77 have base emitter junction area of 5 mil² and when the other transistors have base emitter junctions of 1 mil², the current gain of each stage is 5. The photo diode reverse bias $$V_{rb} = 2V_T \ln \frac{A I_{78}}{I_o} - 2V_T \ln \frac{I_{78}}{I_o}$$

$$= 2V_T \ln A.$$

The reverse voltage $V_{rb}$ across the photo diode is now no longer a function of the photo current $I_{78}$. When the gain A of the first two stages is 25, $$V_{rb} = (0.052) \ln 25 = 0.167 \text{ volts}.$$

Figure 5:
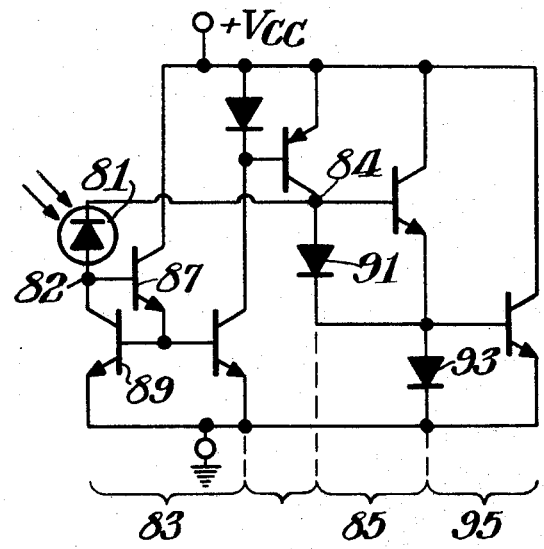

In the circuit of FIG. 5, the photo diode 81 is connected between the inputs 82 and 84 to the first (83) and third (85) stages. In this case, the base-emitter junctions of the transistors 87 and 89 in the first stage 83, represent two forward biased PN junctions to ground while from the input 84 of the third stage to ground there are also serially connected two PN junctions, namely diode 91 that is the input branch of the third stage 85 and diode 93 that is the input branch of the fourth stage 95.

Figure 6:
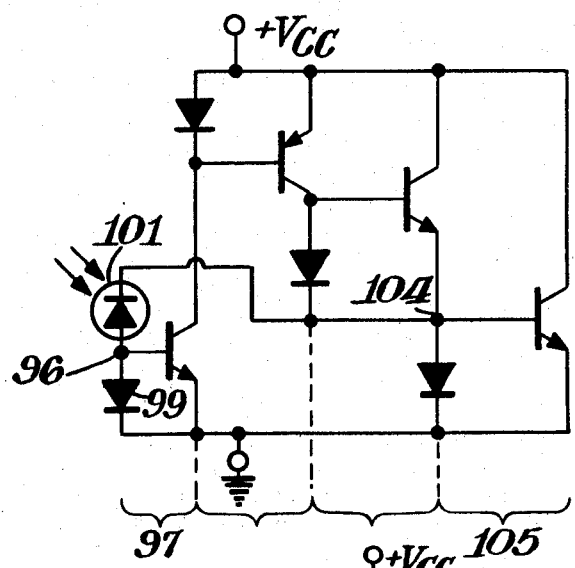

The circuit of FIG. 6 differs with respect to that of FIG. 5, in that the input 96 of the first stage 97 has only one PN junction to ground, namely diode 99; and the photo-diode 101 is connected between the input 96 of the first stage 97 and the input 104 of the fourth stage 105.

Figure 7:
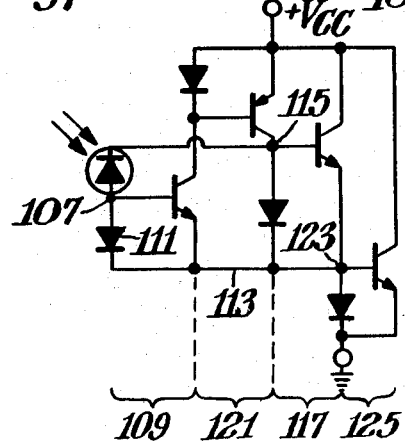

The circuit of FIG. 7 differs from that of FIG. 5, in that the input 107 of the first stage 109 has one PN junction, namely diode 111, to circuit point 113, while the input 115 of the third stage 117 has one PN junction to the common circuit point 113. Then all of the branch currents of the first, second and third stages (109, 121 and 117) flow into the input 123 of the fourth stage 125.

The above circuits represent but a few of the many that may be devised following the principles of this invention.

It should be noted that although there is no way apparent from the diagrams shown for the circuit to begin conducting, that in practice it starts reliably when the DC supply voltage, Vcc, is turned on abruptly as will be the case when it is switched on rather than brought up gradually.

What is claimed is:
1. A stable photo-electric device comprising: a photo diode; and a current-mirror amplifier including a first and third stage each employing one-polarity-type transistors and including an intermediate second stage employing the other-polarity-type transistors, said photo diode being connected between the input of said first stage and the input of said third stage in the polarity tending to reverse bias said photo diode.

2. The photo-electric device of claim 1 additionally comprising a common circuit point and wherein said first stage and third stage inputs have an equal number of serially connected forward biased PN junctions to said common circuit point to provide a low reverse voltage across said photo diode.

3. The photo-electric device of claim 1 additionally comprising a common circuit point and wherein said third stage input has one more serially connected forward biased PN junctions to said common circuit point than does said first stage input.

* * * * *